(12) United States Patent
Aoki et al.

(10) Patent No.: US 7,159,305 B2
(45) Date of Patent: Jan. 9, 2007

(54) ELECTRONIC COMPONENT MOUNTING APPARATUS

(75) Inventors: Akira Aoki, Ota (JP); Hideaki Fukushima, Gunma (JP); Kazuyoshi Oyama, Ashikaga (JP); Shuji Nushiyama, Gunma (JP); Takuya Imoto, Gunma (JP)

(73) Assignee: Hitachi High-Tech Instruments Co., Ltd., Gunma (JP)

( * ) Notice: Subject to any disclaimer, the term of this patent is extended or adjusted under 35 U.S.C. 154(b) by 139 days.

(21) Appl. No.: 10/974,967

(22) Filed: Oct. 28, 2004

(65) Prior Publication Data

US 2005/0132565 A1 Jun. 23, 2005

(30) Foreign Application Priority Data

Oct. 31, 2003 (JP) .............................. 2003-371869

(51) Int. Cl.
*B23P 21/00* (2006.01)
(52) U.S. Cl. ............................ 29/720; 29/721; 29/740; 29/743; 356/615
(58) Field of Classification Search .......... 29/740–744, 29/834, 720–722, DIG. 44, 739, 564; 414/277, 414/286, 737, 752; 198/619; 294/64.1; 356/614–615; 250/559.19
See application file for complete search history.

(56) References Cited

U.S. PATENT DOCUMENTS

| | | | | |
|---|---|---|---|---|
| 4,704,792 A | * | 11/1987 | Itagaki et al. .................. 29/741 |
| 5,203,061 A | * | 4/1993 | Hamada ..................... 29/33 M |
| 5,379,514 A | * | 1/1995 | Okuda et al. ................. 29/833 |
| 5,778,525 A | * | 7/1998 | Hata et al. ..................... 29/836 |
| 5,839,186 A | * | 11/1998 | Onodera ...................... 29/720 |
| 6,144,452 A | * | 11/2000 | Hachiya ..................... 356/615 |
| 6,796,022 B1 | * | 9/2004 | Kashitani et al. ............. 29/740 |
| 2004/0139597 A1 | | 7/2004 | Oyama |

FOREIGN PATENT DOCUMENTS

| | | |
|---|---|---|
| EP | 1246519 A | 10/2002 |
| JP | 2002-299898 | 10/2002 |

* cited by examiner

*Primary Examiner*—Minh Trinh
(74) *Attorney, Agent, or Firm*—Morrison & Foerster LLP

(57) ABSTRACT

An electronic component mounting apparatus is configured to adjust a positional relationship between two axes when an error occurs in the positional relationship between the axes when a beam is moved by two drive sources. According to movement of the beam for component picking and mounting operations, linear scale signals from linear scale reading heads are inputted to a Y2 driver and a Y1 driver, respectively. Each of the Y2 driver and the Y1 driver calculates a difference between positions of the drive axes of the beam and controls a moving member of a linear motor based on the difference so as to increase thrust of one drive axis when the one drive axis is in a more backward position than another drive axis and to reduce the thrust of one drive axis when the one drive axis in a more forward position than another drive axis.

6 Claims, 19 Drawing Sheets

ELECTRONIC COMPONENT MOUNTING APPARATUS

CROSS-REFERENCE OF THE INVENTION

This invention is based on Japanese Patent Application No. 2003-371869, the content of which is incorporated by reference in its entirety.

BACKGROUND OF THE INVENTION

1. Field of the Invention

This invention relates to an electronic component mounting apparatus having a plurality of component feeding devices aligned on a base and feeding an electronic component to a component pickup position, a beam movable in one direction by two drive sources, and a mounting head with suction nozzles movable in an orthogonal direction to the moving direction of the beam and movable between the component feeding devices and a printed board to pick the electronic component up from the component feeding device and mount the component on the printed board.

2. Description of the Related Art

This type of electronic component mounting apparatus is disclosed, for example, in Japanese Patent Application Publication No. 2002-299898. Specifically, a technology of moving a beam in a Y direction by two drive sources each provided on each end of the beam is disclosed in Japanese Patent Application Publication No. 2002-299898.

However, although it is desirable that a positional relationship between two axes is the same at any time when the beam is operated by two drive sources, a load imbalance between the axes, a synchronizing error in command sending to each of the axes, a friction imbalance between the axes, a difference between linear scales of the axes, and so on can cause errors in the positional relationship between the axes.

SUMMARY OF THE INVENTION

The invention provides an electronic component mounting apparatus that includes a component feeding unit feeding an electronic component, a beam moving in a first direction along a first drive axis and a second drive axis, a first driven portion moving the beam along the first drive axis, a second driven portion moving the beam along the second drive axis, a mounting head that moves along the beam for picking the electronic component up from the component feeding unit and mounting the electronic component on a printed board, a memory storing data on a picking up position of the electronic component and data on a mounting position of the electronic component on the printed board, a controller sending a command, which is generated based on the data stored in the memory, to move the beam to a position for the picking up and the mounting of the electronic component, a first driver circuit providing a first control electric current to the first driven portion in response to the command from the controller, and a second driver circuit providing a second control electric current to the second driven portion in response to the command from the controller. The first driver circuit is configured to calculate the difference between positions of the first and second driven portions along the first direction and to adjust the first control electric current based on the difference so as to increase a driving power of the first driven portion when the first driven portion is behind the second driven portion along the first direction and to reduce the driving power when the first driven portion is ahead of the second driven portion along the first direction.

DETAILED DESCRIPTION OF THE INVENTION

Figure 1:
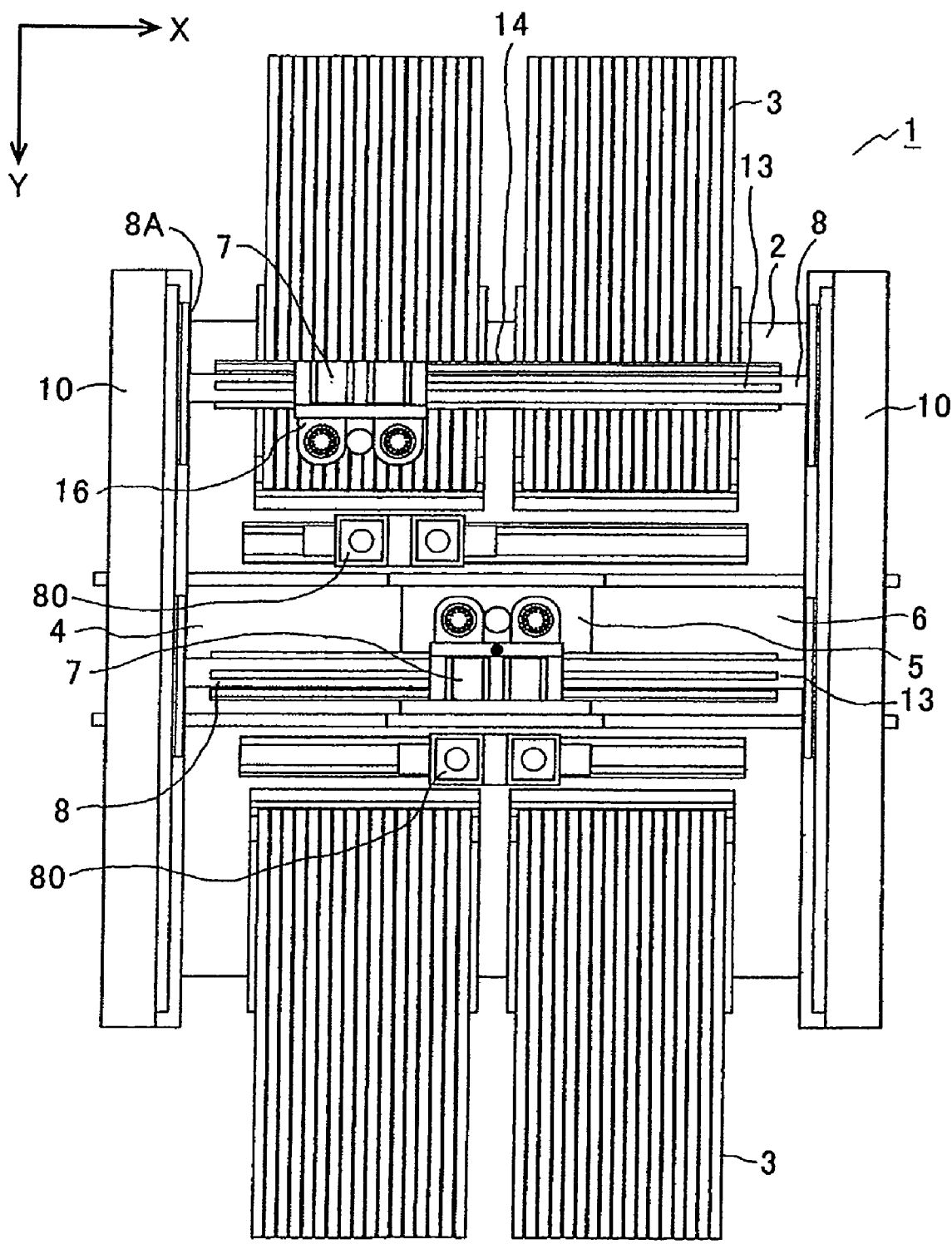
FIG. 1 is a plan view of an electronic component mounting apparatus of an embodiment of this invention.
Figure 2:
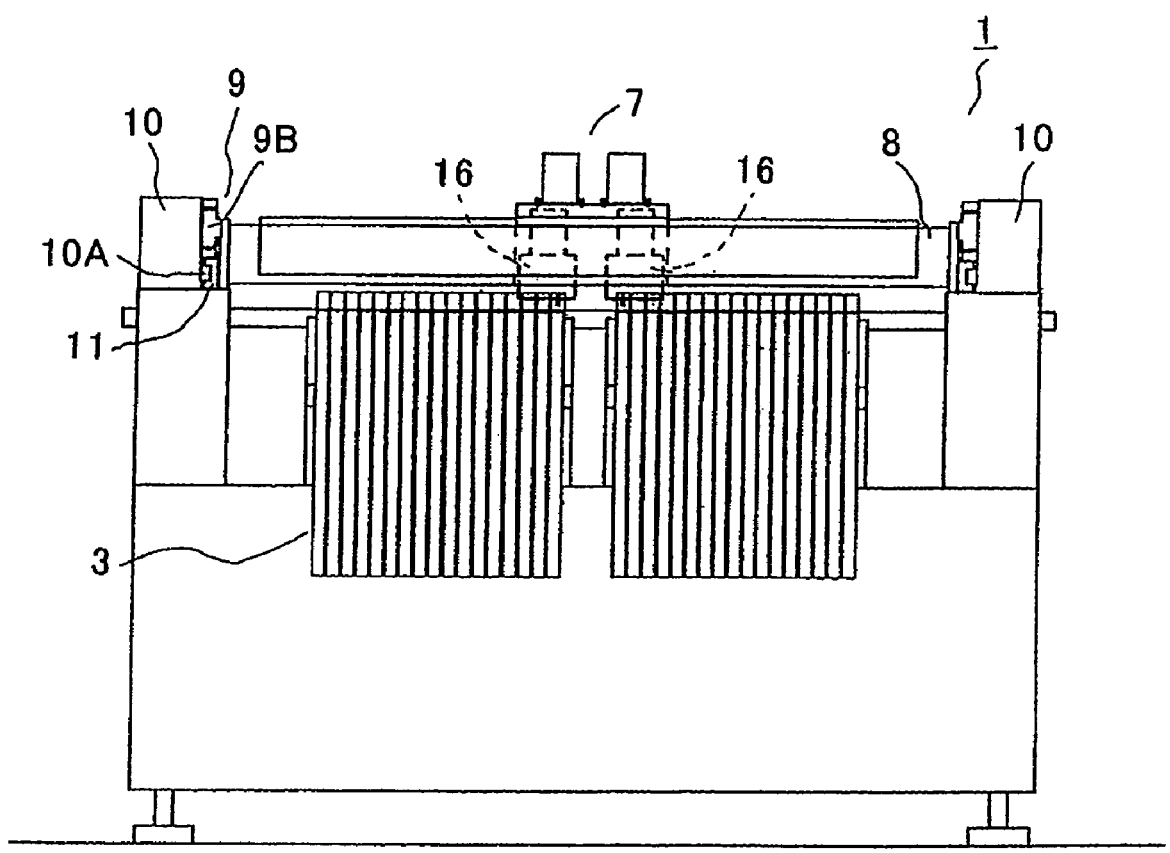
FIG. 2 is a front view of the electronic component mounting apparatus of FIG. 1.
Figure 3:
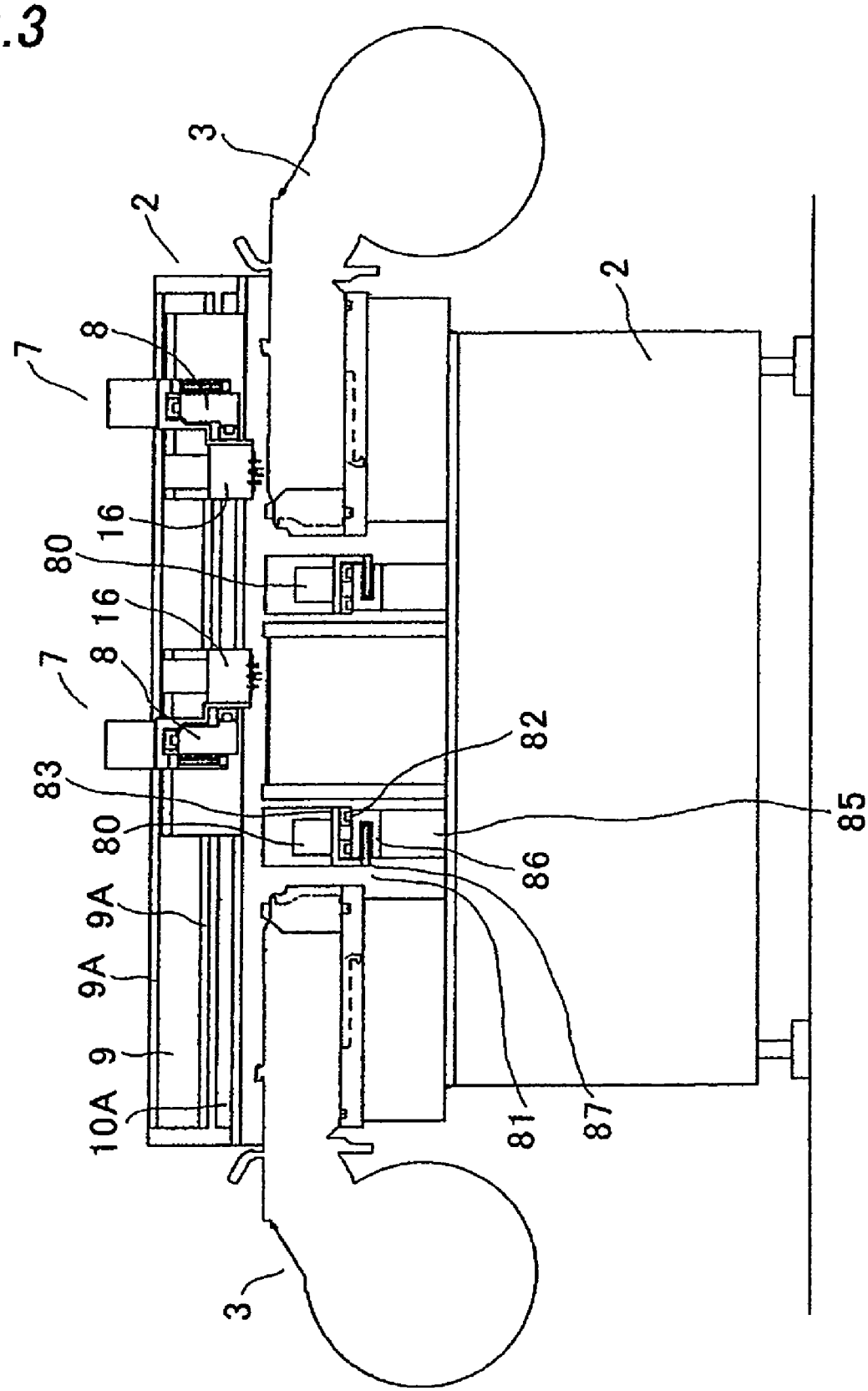
FIG. 3 is a right side view of the electronic component mounting apparatus of FIG. 1.

An embodiment of an electronic component mounting apparatus of the invention will be described with reference to the attached drawings. FIG. 1 is a plan view of an electronic component mounting apparatus 1, FIG. 2 is a front view of the electronic component mounting apparatus 1, and FIG. 3 is a right side view of the electronic component mounting apparatus 1. A plurality of component feeding units 3 as a component feeding device for feeding a variety of electronic components one by one to each of component feeding positions (component pick-up positions) is attachably and detachably aligned and fixed on a base 2 in the apparatus 1. A feed conveyer 4, a positioning portion 5, and a discharge conveyer 6 are provided between groups of the units 3 facing each other. The feed conveyer 4 conveys a printed board P received from an upstream to the positioning portion 5, an electronic component is mounted on the printed board P positioned by a positioning device (not shown) in the positioning portion 5, and the printed board P is conveyed to the discharge conveyer 6.

A numeral 8 designates a pair of beams extending in an X direction. Each of the beams 8 respectively moves in a Y direction above the printed board P on the positioning portion 5 or the component feeding positions (component pick-up positions) of the component feeding units 3 as sliders 11 respectively fixed to the beams 8 slide along guides 10A provided in a pair of left and right guides 10, driven by linear motors 9 as drive axes for driving two end portions of each of the beams 8. Each of the linear motors 9 has a pair of upper and lower stationary members 9A fixed on the base 2 and a moving member 9B fixed to a lower part of an attachment board 8A provided on each end of the beam 8.

Each of the beams 8 is provided with a mounting head body 7 which moves in a longitudinal direction, i.e., in the X direction along guides 13 driven by the linear motor 14. The linear motor 14 has a pair of front and back stationary members 14A fixed to the beam 8 and a moving member 14B provided on the mounting head body 7. Each of the mounting head bodies 7 has two mounting heads 16 each having twelve suction nozzles 15 each fixed to and pulled up by each of twelve springs 12.

Figure 5:
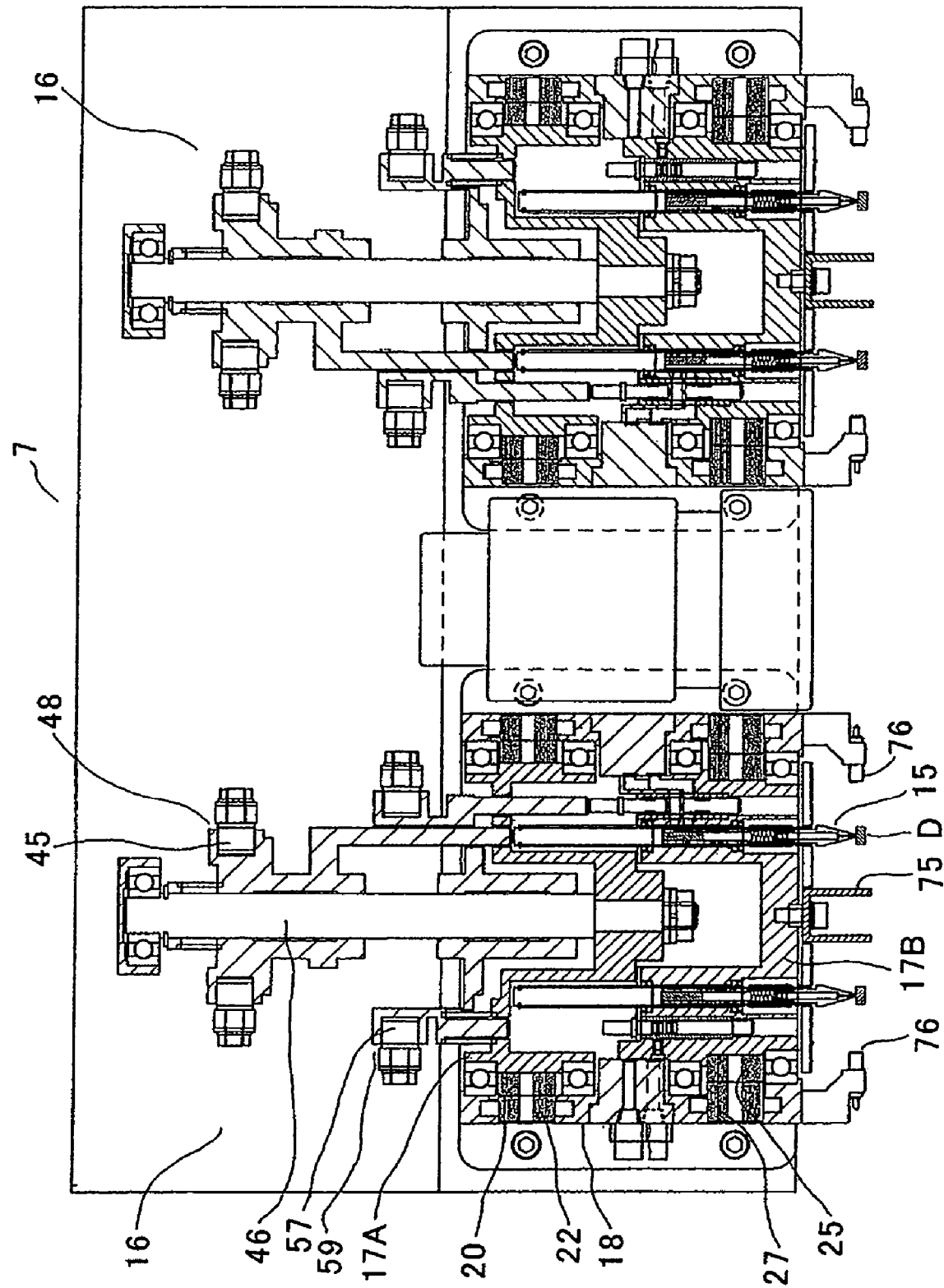
FIG. 5 is a front view of a vertical cross-section of a mounting head body of the embodiment.

The mounting head 16 will be described with reference to FIGS. 5 and 6. A numeral 20 designates a rotor of a pulse motor 21 which is provided in an upper part of a first inner cylinder 17A and rotatable in a θ direction being contact with bearings 23 inside a stator 22 provided in an outer cylinder 18 fixed to the mounting head body 7. A numeral 25 designates a rotor of a pulse motor 26 which is provided in a lower part of a second inner cylinder 17B and rotatable in a θ direction being contact with bearings 28 inside a stator 27 provided in the outer cylinder 18 fixed to the mounting head body 7. Twelve suction nozzles 15 are provided on a circumference of a circle at predetermined intervals inside the second inner cylinder 17B, being movable upward and downward.

Figure 10:
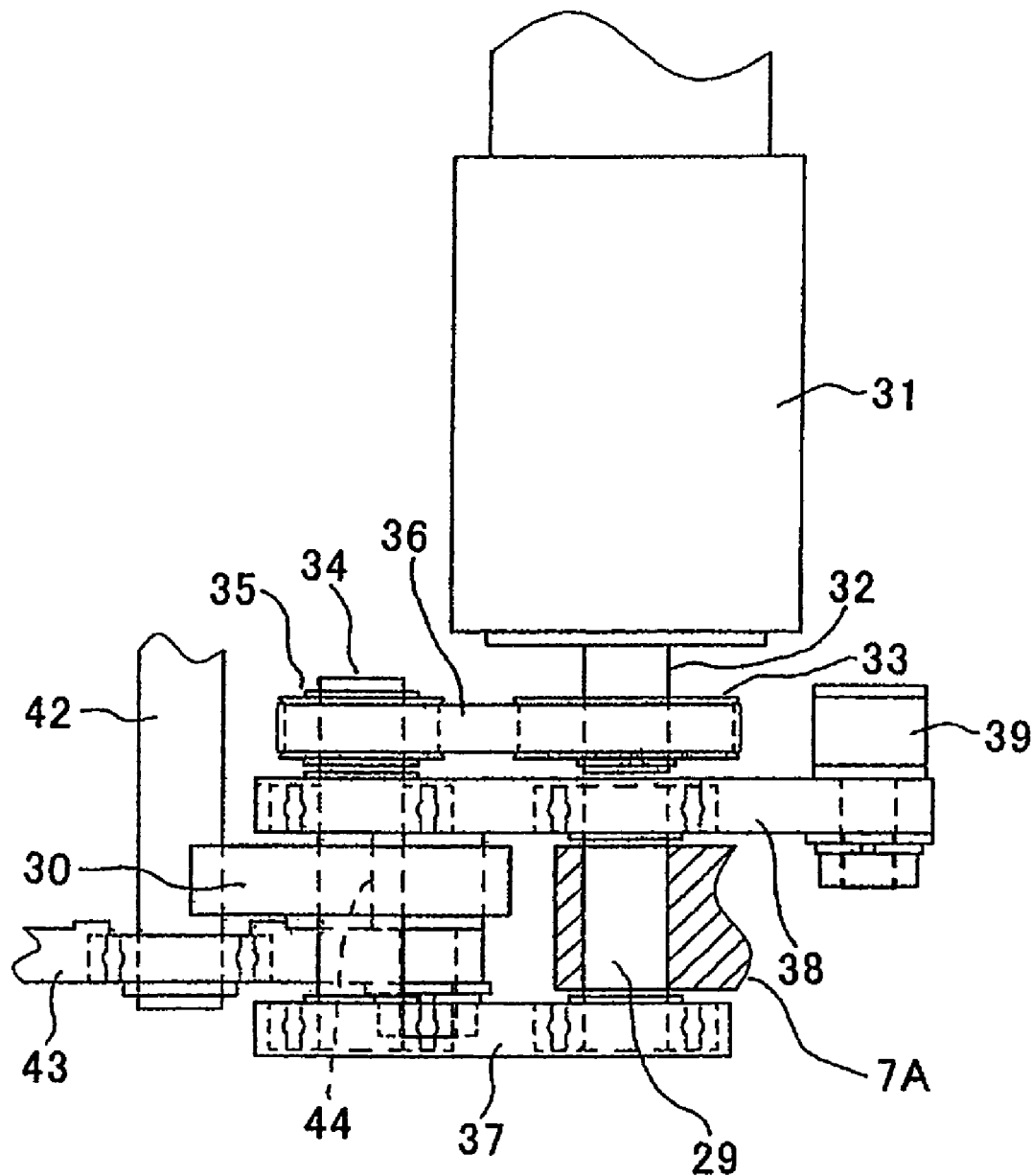
FIG. 10 is a plan view of a first cam and a first lever of the embodiment.
Figure 11:
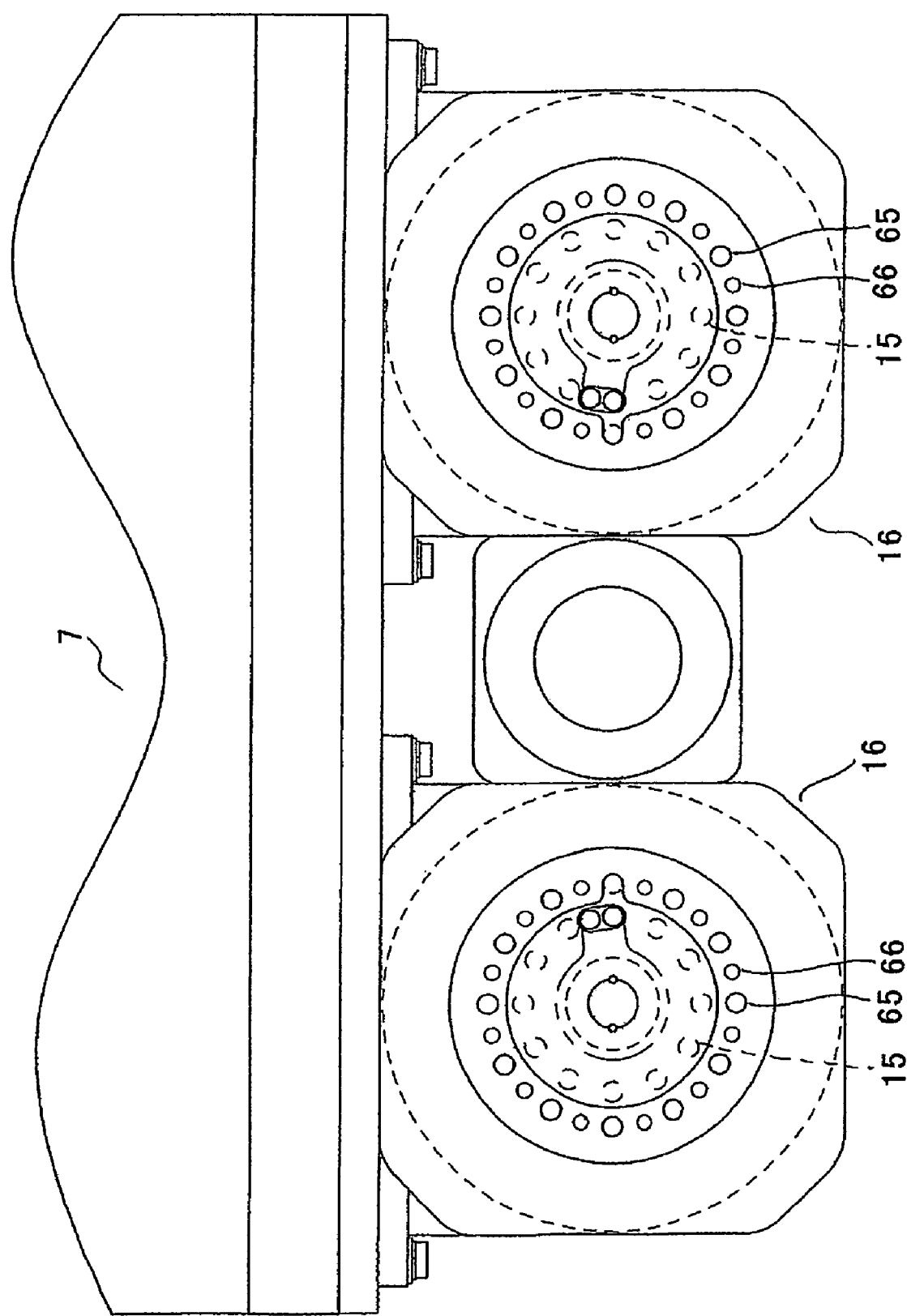
FIG. 11 is a plan view of the mounting head body of FIG. 5.
Figure 12:
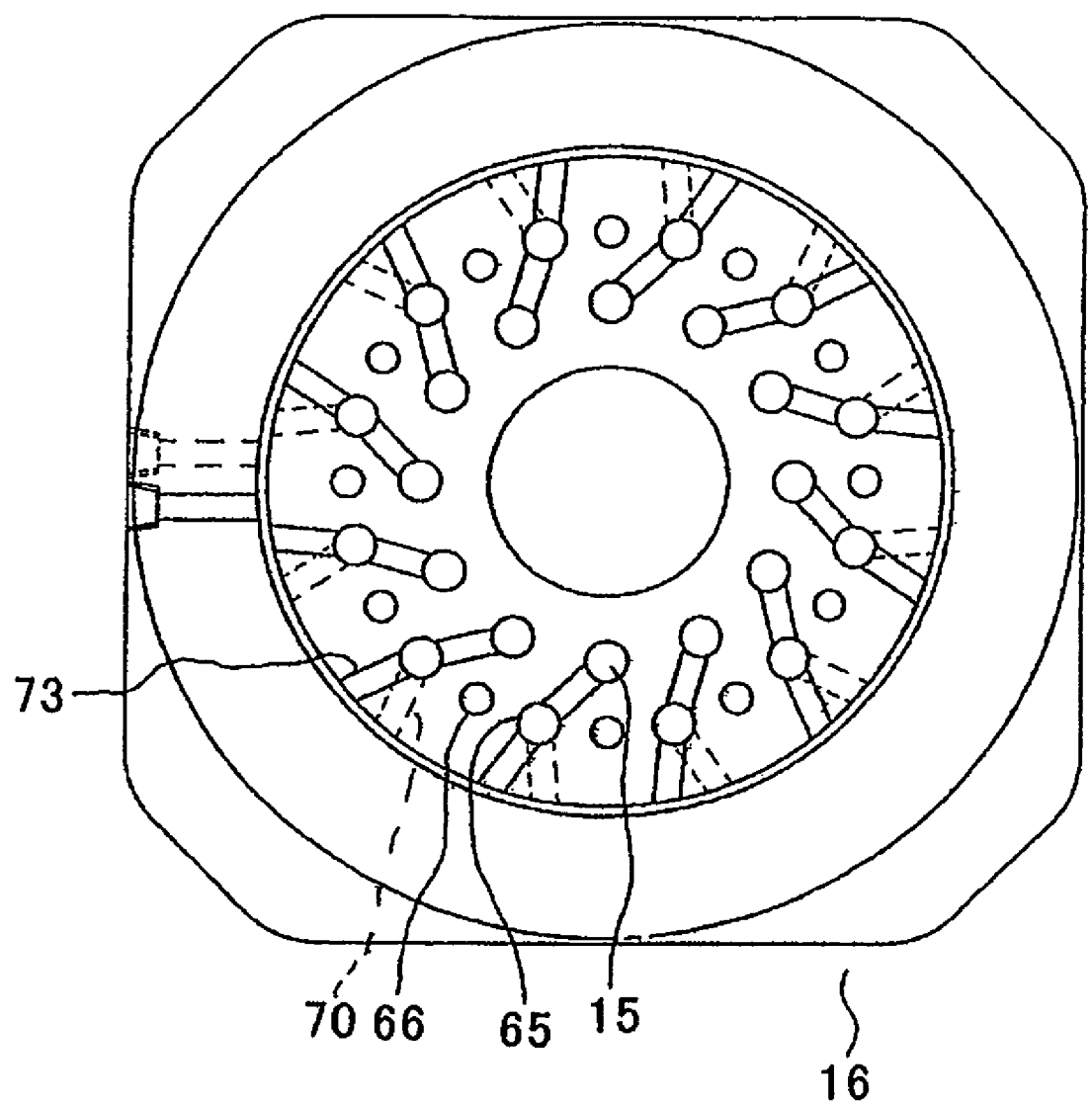
FIG. 12 is a simplified plan view showing a vacuum state or an air blow state when a suction nozzle picks or mounts an electronic component in the embodiment.

A numeral 30 designates a first cam which makes a basic up-and-down stroke of the suction nozzles 15. The first cam 30 which is fixed to a follower axis 34 rotates by a belt 36 stretched between a pulley 33 provided on a driving axis 32 and a pulley 35 provided on the follower axis 34, driven by a drive motor 31 (FIG. 10). A cam follower 39 is provided on one side of a first lever 38 which is rotatable around a support axis 29 supported by a support portion 7A extending from the mounting head body 7. The support axis 29 and the follower axis 34 are connected with a connecting lever 37.

A numeral 40 designates a second cam which rotates driven by a drive motor 41 and makes an aligned up-and-down stroke of the suction nozzles 15 corresponding to a thickness of an electronic component. The cam follower 39 is pressed into contact with a circumference of the second cam 40. A cam follower 44 is provided on one end of the second lever 43 which turns around a support axis 42, and is pressed into contact with a circumference of the first cam 30. A cam follower 45 is provided on another end of the second lever 43, and engaged with a cam engagement portion 48 of a vertical shift body 47 which is movable upward and downward along a strut 46 which is a center of θ rotation of the mounting head 16. A spring 50 is interposed between the vertical shift body 47 and a support body 49, and pressurizes the vertical shift body 47 downward.

Figure 6:
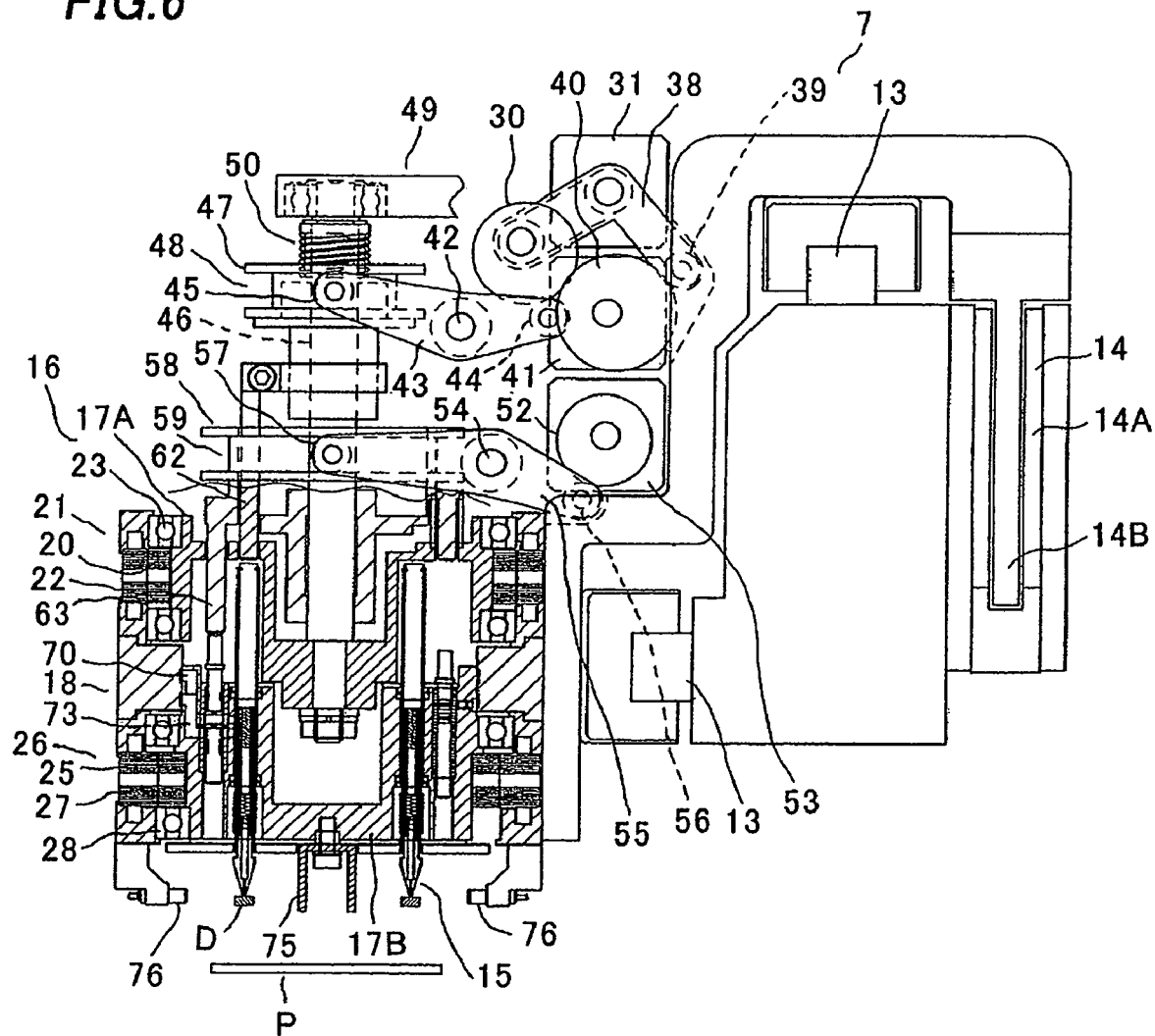
FIG. 6 is a side view of the vertical cross-section of the mounting head body of FIG. 5, holding a thin electronic component by suction.

As shown in FIG. 6, a numeral 52 designates a third cam for switching a vacuum valve, which rotates driven by the drive motor 53. A cam follower 56 on one end of a third lever 55 which turns around a support axis 54 is pressed into contact with the third cam 52. A cam follower 57 on another end of the third lever 55 is engaged with a cam engagement portion 59 of a vacuum valve switch operating body 58 which is movable upward and downward corresponding to movement of the vertical shift body 47.

The vertical shift body 47 is provided with a vertical shift bar 62 for raising and lowering the suction nozzles 15. By rotation of the first cam 30 and the second cam 40, the first lever 38 and the second lever 43 turn around the support axis 29 and the support axis 42 respectively. Then, the vertical shift body 47 descends and the vertical shift bar 62 lowers the suction nozzles 15 by a predetermined stroke corresponding to a thickness of an electronic component D, thus completing mounting of the electronic component D on the printed board P.

Figure 14:
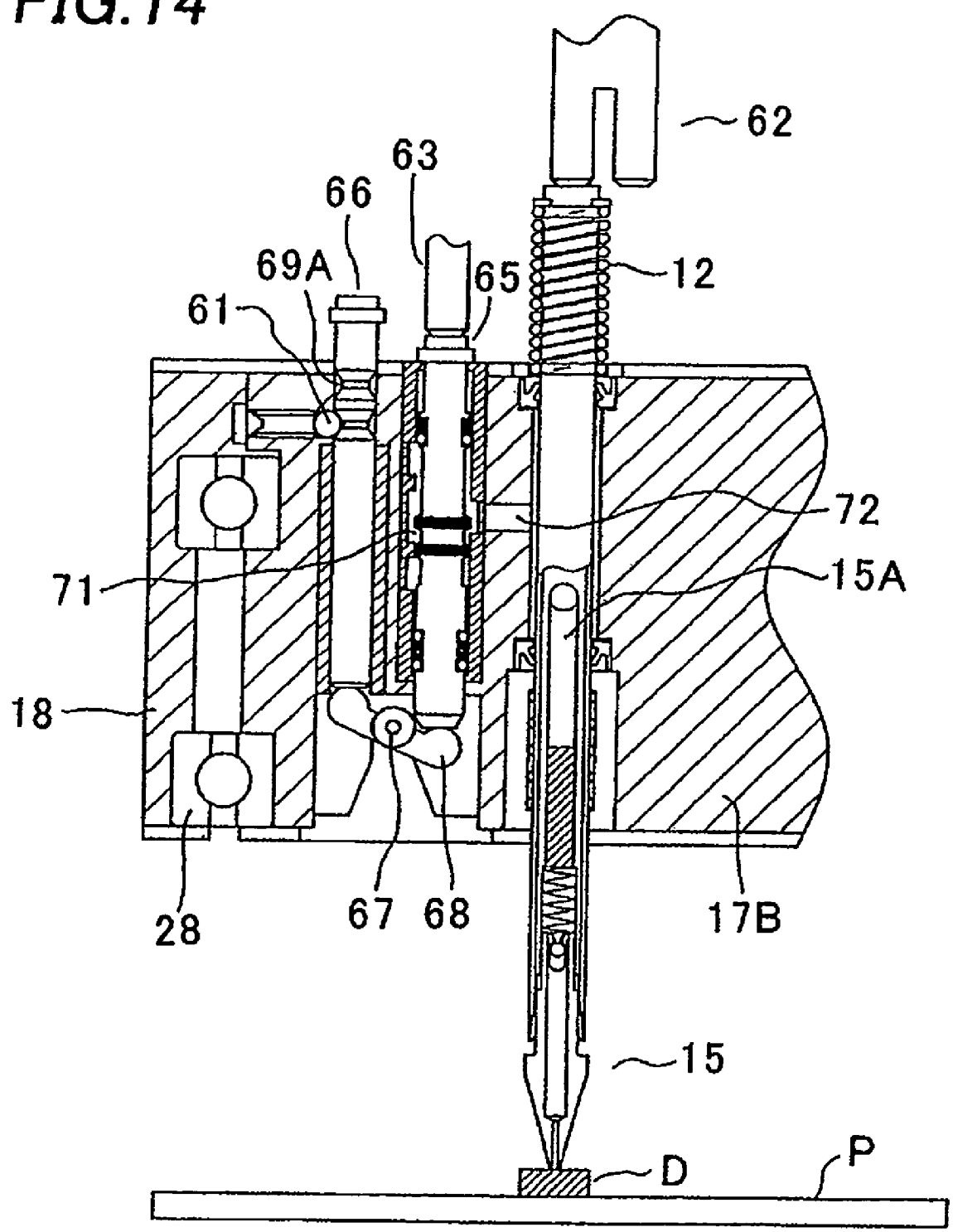
FIG. 14 is a side view of a vertical cross-section of the main portion of the mounting head body of FIG. 5, mounting a thin electronic component.
Figure 16:
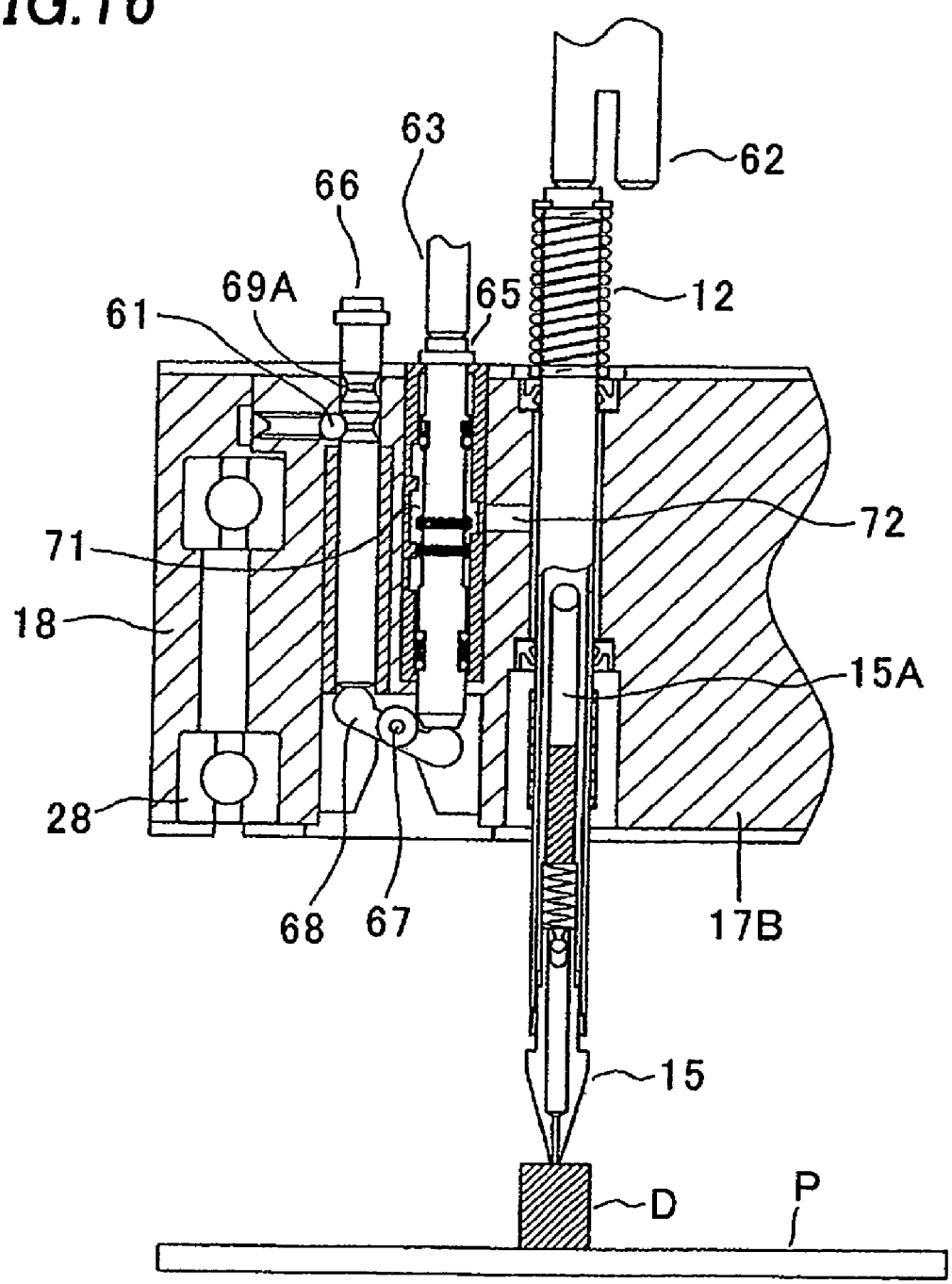
FIG. 16 is a side view of a vertical cross-section of the main portion of the mounting head body of FIG. 5, mounting a thick electronic component.
Figure 18:
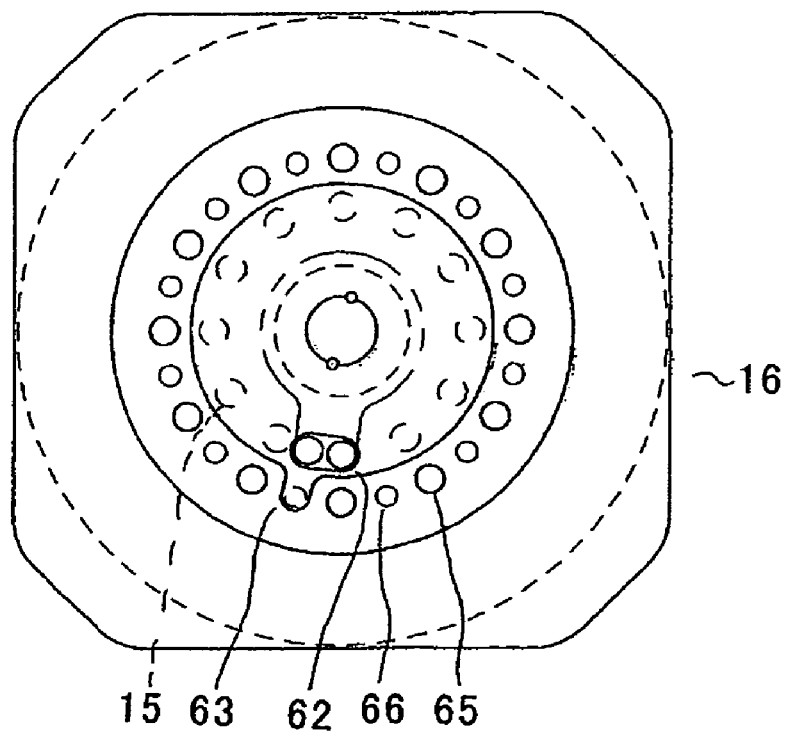
FIG. 18 is a plan view of the mounting head of FIG. 5, mounting an electronic component.

When the suction nozzle 15 descends for mounting, as shown in FIGS. 14, 16, and 18, turning of the third lever 55 by rotation of the third cam 52 makes the vacuum valve switch operating body 58 descend corresponding to descending of the vertical shift body 47 connected therewith through the cam engagement portion 59. The vertical shift bar 63 of the vacuum valve switch operating body 58 depresses a first switch bar 65 to turn a switch lever 68 around a support axis 67 and to push a second switch bar 66 upward, so that a projected stopper 61 is engaged with a recess for engagement 69B of the second switch bar 66.

Figure 13:
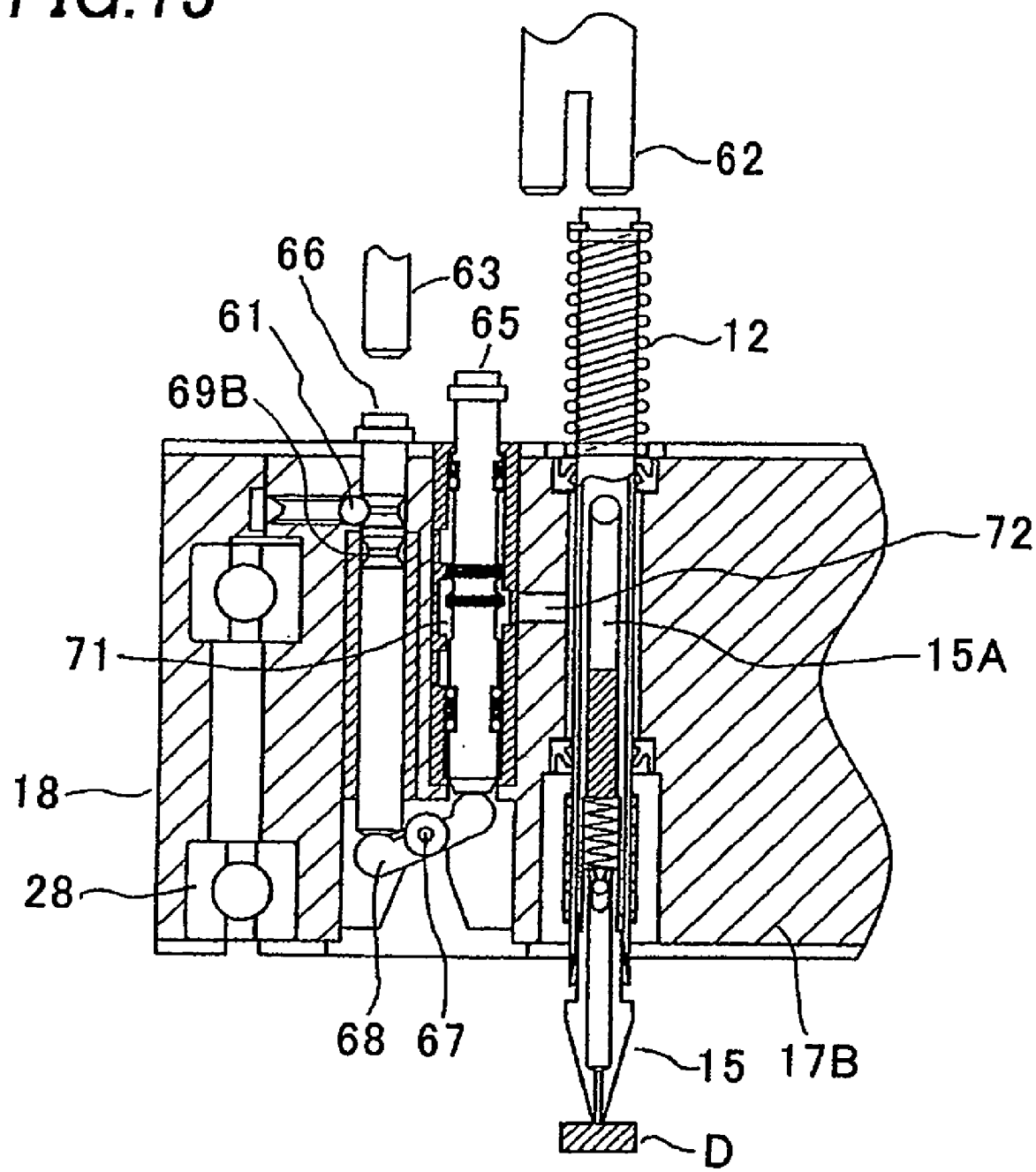
FIG. 13 is a side view of a vertical cross-section of the main portion of the mounting head body of FIG. 5, holding a thin electronic component by suction.
Figure 15:
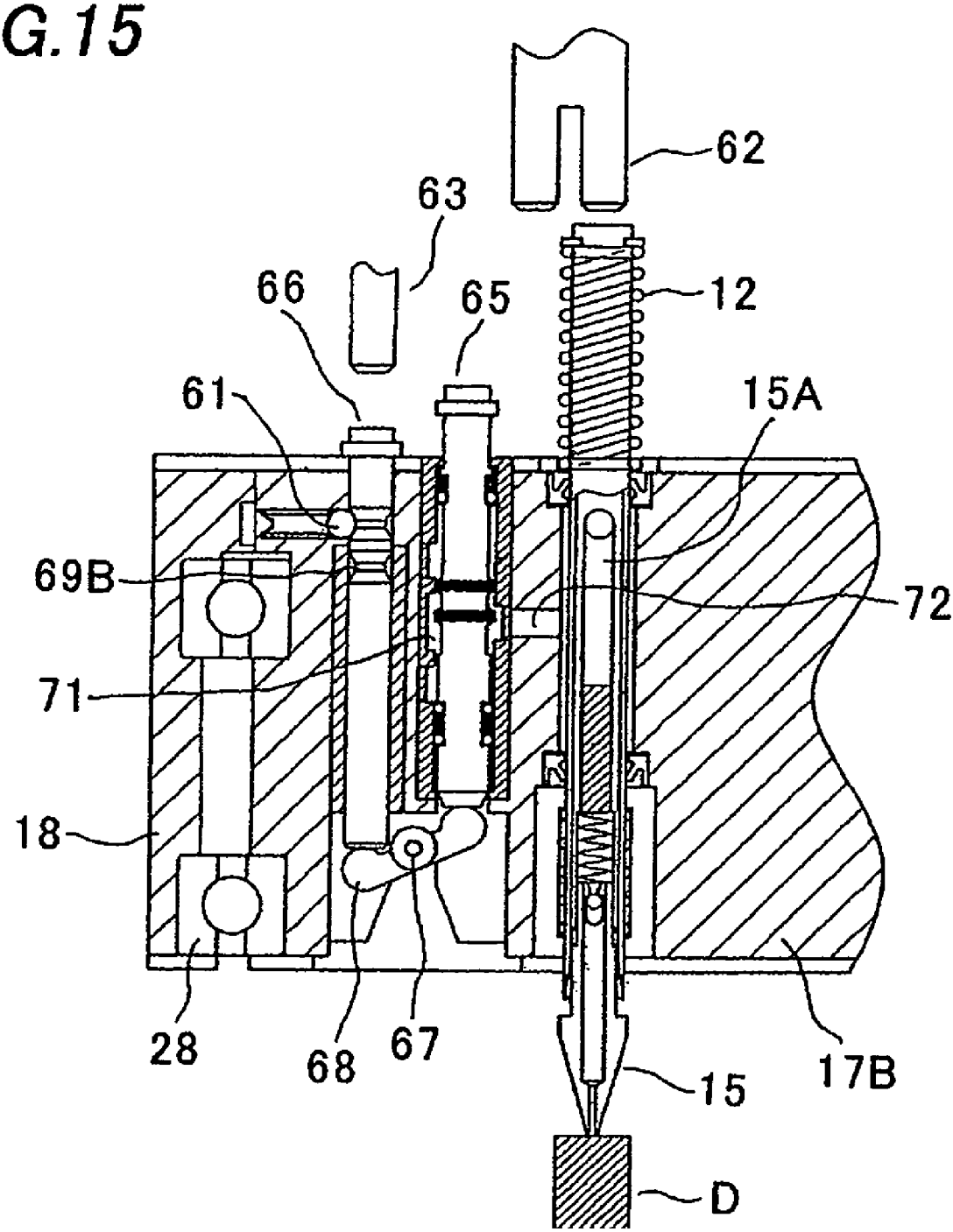
FIG. 15 is a side view of a vertical cross-section of the main portion of the mounting head body of FIG. 5, holding a thick electronic component by suction.
Figure 17:
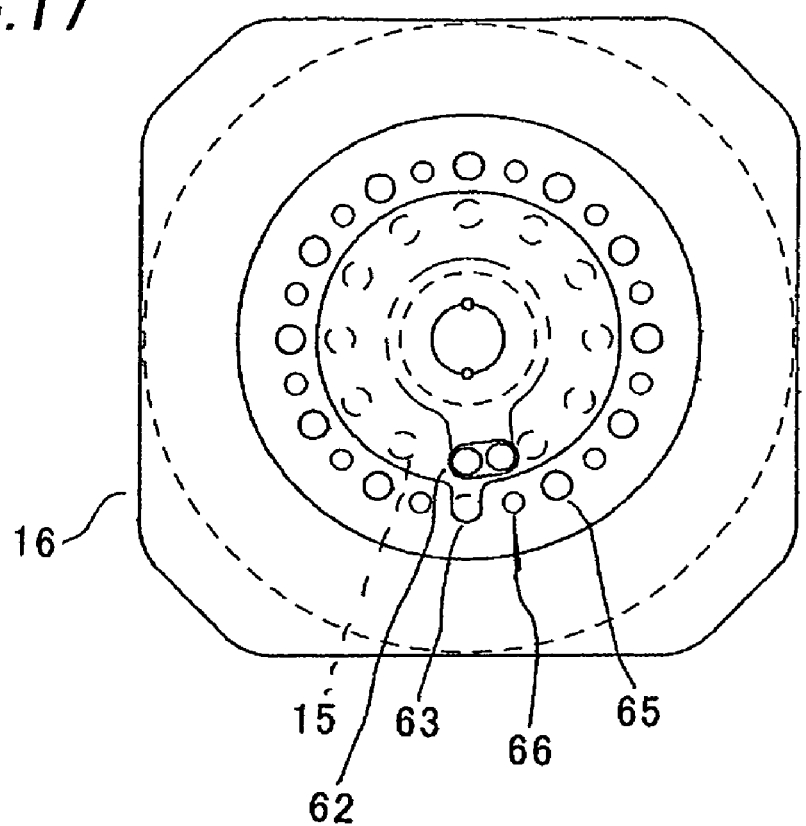
FIG. 17 is a plan view of the mounting head of FIG. 5, holding an electronic component by suction.

When picking the electronic component up, as shown in FIGS. 13, 15, and 17, the vertical shift bar 63 of the vacuum valve switch operating body 58 depresses the second switch bar 66 to turn the switch lever 68 around the support axis 67 and to push the first switch bar 65 upward, so that the projected stopper 61 is engaged with a recess for engagement 69A of the second switch bar 66.

The vacuum path is disconnected from a vacuum source and air blows in the suction nozzle 15 so as to cease the vacuum suction of the electronic component D by the suction nozzle 15 when the first switch bar 65 descends in response to the descending of the vertical shift bar 63 of the vacuum valve switch operating body 58 during the mounting. On the other hand, the vacuum path is connected to the vacuum source so as to maintain the vacuum suction of the electronic component D by the suction nozzle 15 when the second switch bar 66 descends.

That is, air from an air supply source blows in an inner path 15A of the suction nozzle 15 through an air path 70, a path 71, and a connecting path 72 in the state where the first switch bar 65 descends. On the contrary, vacuum suction is performed by connecting the inner path 15A of the suction nozzle 15 to the vacuum source through the connecting path 72, the path 71, and a vacuum path 73 in the state where the second switch bar 66 descends.

A reflection board 75 shaped in a dodecagon at its cross-section is provided in a center of a bottom surface of the second inner cylinder 17B, and four light detection sensors 76 are provided on a bottom surface of the outer cylinder 18 at intervals of 90 degrees. When the suction nozzle 15 rises up after descending and picking the electronic component D up from the component feeding unit 3, the electronic component D held by the suction nozzle 15 by suction is positioned between the reflection board 75 and the light detection sensors 76, so that presence or absence of the electronic component D is detected at the positions of 90-degree intervals, that is, the positions of 0 o'clock, 3 o'clock, 6 o'clock, and 9 o'clock.

That is, when the suction nozzle 15 does not hold the electronic component D, light from the light detection sensor 76 reaches the reflection board 75 shaped in a dodecagon at its cross-section and the light reflected there is received by the light detection sensor 76, so that a result of the detection of the electronic component D is "absence". Therefore, a vacuum suction operation of the electronic component D from the vacuum source by the suction nozzle 15 is stopped to prevent leakage. On the other hand, when the suction nozzle 15 holds the electronic component D, the light detection sensor 76 does not receive the reflected light, so that the result of the detection of the electronic component D is "presence". Therefore, the vacuum suction operation is kept until the electronic component D is mounted on the printed board P.

A numeral 80 designates a component recognition camera. The component recognition camera 80 is provided on sliders 83 so that there are four cameras 80 in total. The cameras 80 sequentially take images of all the electronic components D picked up by the suction nozzles 15 to detect an amount of shifting from a proper position of the electronic component D on the suction nozzle 15 in X and Y directions and at rotating angles. Alternatively, the cameras 80 can take images of the plurality of the electronic components D simultaneously.

As shown in FIG. 3, each of the linear motors 81 is driven, and each of sliders 83 fixed with the component recognition cameras 80 slides along a pair of left and right guides 82 and moves in parallel with a conveying direction of the printed board P on the positioning portion 5 and an alignment direction of the component feeding units 3, i.e., in the X direction. Each of the linear motors 81 has a pair of upper and lower stationary members 86 fixed to a mount 85 fixed on the base 2 and a moving member 87 provided in the slider 83.

Figure 4:
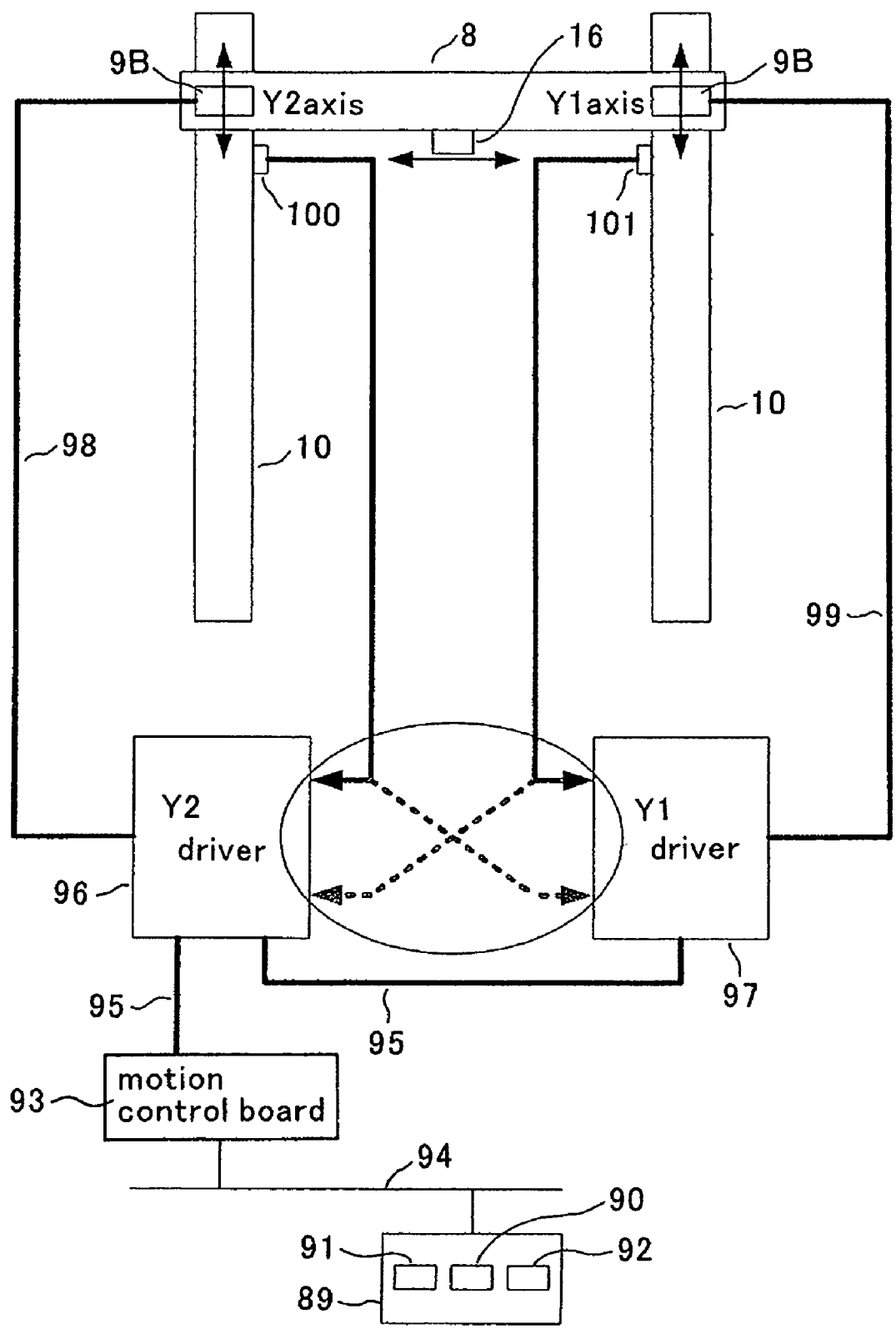
FIG. 4 is a block diagram of a system control of a linear motor of the embodiment.

Next, description will be made with reference to a block diagram showing a system control of the linear motor 9 shown in FIG. 4. A numeral 89 designates a CPU board. The CPU board 89 has a CPU (mounting control portion) 90 as a control portion for controlling the mounting apparatus 1, a RAM (random access memory) 91, and a ROM (read only memory) 92. The CPU 90 controls all operation for component mounting of the electronic component mounting apparatus 1 according to programs stored in the ROM 92 based on data stored in the RAM 91. FIG. 4 shows a system control block diagram relating to a drive control of the linear motor 9 for the convenience.

The RAM 91 is stored with mounting data on component mounting which include values in the X and Y directions and an angle on the printed board, alignment numbers of the component feeding units 3 on the base 2, group setting data for sequential pickup in one stroke of the beam 8, component IDs showing types of the electronic components, and so on in order of component mounting (in order of step number). A sequential process is performed to the number of steps inputted with the group setting data. Furthermore, the RAM 91 is stored with component disposition data which include types of the electronic components (component IDs) corresponding to alignment numbers of the component feeding units 3. Furthermore, the RAM 91 is stored with data of characteristics of the electronic components such as shapes including sizes in x and y directions or a thickness, or component library data having items such as recognition data and so on.

A numeral 93 designates a motion control board. The motion control board 93 is connected with the CPU board 89 through a bus 94, and receives information necessary for moving the beam 8 in the Y direction, that is, the mounting data or the component disposition data from the RAM 91 and stores the information in its memory (not shown). The motion control board 93 outputs a positioning command (an amount to be shifted) to a Y2 driver 96 and a Y1 driver 97 through a motion network line 95 based on the stored information.

When receiving the positioning command from the motion control board 93, each of the Y2 driver 96 and the Y1 driver 97 provides a predetermined electric current to a moving member 9B of each of the linear motors 9 through power lines 98 and 99 respectively.

Numerals 100 and 101 are linear scale reading heads provided in the beam 8. The linear scale reading heads 100 and 101 read scales of the linear scales each provided on a body of the component mounting apparatus along each of the guides 10, and outputs read-out values to both the Y2 driver 96 and Y1 driver 97 as linear scale signals. The linear scale has the scale and the linear scale reading head.

Under the structure described above, an operation will be described as follows. First, the printed board P is conveyed from upstream to the positioning portion 5 through the feed conveyer 4, and the positioning device starts a positioning operation.

Next, the CPU 90 forms pick-up sequence data from the mounting data stored in the RAM 91. That is, the CPU 90 reads out data from the mounting data, decides a picking-up procedure of the suction nozzles 15, detects the last component feeding unit 3 which feeds the last electronic component D in a sequential picking-up process (12 components can be picked up for one mounting head 16 at maximum) and stores coordinates of a last pick-up position of the component feeding unit 3 in the RAM 91, detects coordinates of a first mounting position of the component D after completing the sequential picking-up process (a position stored in mounting data before alignment) and stores the coordinates in the RAM 91, and calculates an X abscissa of a position which the component recognition cameras 80 should move to.

This is for driving and moving the component recognition cameras 80 (two cameras) in the X direction so that the cameras 80 can be previously positioned on a line which connects the last pick-up position of the component by the mounting head 16 and the first mounting position of the component on the printed board P, in a sequential picking-up process. Thus, the cameras 80 can simultaneously take images of all the electronic components picked up by the suction nozzles 15 of the left and right mounting heads 16 by "on the fly recognition without stopping of the beam 8" at the time when the beam 8 is moving from the last pick-up position to the first mounting position. This prevents wasting of time for moving the beam 8 for shifting to a component recognition process.

Accordingly, after calculation of the X abscissa of the position which the component recognition cameras 80 should move to, the cameras 80 move to the calculated position. Then, a picking operation of the electronic components D is performed.

In detail, the suction nozzles 15 corresponding to types of the electronic components pick up the electronic components to be mounted from the predetermined component feeding units 3 according to the mounting data or the component disposition data stored in the RAM 91 where a position of an X abscissa and a Y ordinate on the printed board to be mounted with the component, a position at a rotation angle around a vertical axis, an alignment number and so on are specified. For this pick-up operation, the linear motors 9 and 14 are controlled by the CPU 90, and the suction nozzle 15 of the mounting head 16 in the mounting head body 7 moves to a position above the first electronic component in the component feeding unit 3 which has the electronic components to be mounted. Each of the head bodies 7 moves in the Y direction by moving of the beam 8 along the pair of the guides 10A driven by the linear motor 9 and in the X direction along the guides 13 driven by the linear motor 14.

At this time, the predetermined component feeding unit 3 is already driven and the electronic component is ready to be picked up at a feeding position of the unit 3. The suction nozzle 15 is selected by rotating of the first inner cylinder 17A and the second inner cylinder 17B of the mounting head 16 driven by the pulse motors 21 and 26, and positioned on one of 0, 3, 6, and 9 o'clock positions in the mounting head 16 and above the component feeding position of the component feeding unit 3. The first cam 30 rotates to set at a predetermined angle driven by the drive motor 31, the second lever 43 turns around the support axis 42, and the vertical shift body 47 descends to lower the vertical shift bar 62 so that the suction nozzle 15 descends by a predetermined stroke to firmly pick the electronic component D up from the component feeding unit 3. Then, the first cam 30 rotates to set at a predetermined angle and the second lever 43 turns so that the vertical shift body 47 rises up to raise the suction nozzle 15.

At this time, the third cam 52 rotates driven by the drive motor 53 to turn the third lever 55, the vacuum valve switch operating body 58 descends corresponding to descending of the vertical shift body 47, and the vertical shift bar 63 descends to push the second switch bar 66 downward. Then, the inner path 15A of the suction nozzle 15 becomes connected to the vacuum source through the connecting path 72, the path 71, and the vacuum path 73, so that the suction nozzle 15 picks the electronic component D up from the component feeding unit 3 by vacuum suction and rises up with the electronic component D. The mounting head 16 rotates driven by the pulse motors 21 and 26, and the first inner cylinder 17A and the second inner cylinder 17B turn around the strut 46 to rotate the suction nozzle 15 holding the electronic component D by suction. During the rotation, the electronic component D held by the suction nozzle 15 comes between the reflection board 75 and the light detection sensors 76, and detecting of presence or absence of the electronic component D is performed. In a case where the electronic component D is held by the suction nozzle 15, the light detection sensors 76 does not receive reflected light, so that a result of the detection is "presence" and the vacuum suction operation is kept until the component is mounted on the printed board P.

When sequential pick-up operation can be performed by the mounting head 16, the pulse motors 21 and 26 are driven to rotate the mounting head 16 and to move the suction nozzle 15 selected for a next pick-up operation to a position above a component feeding position of the component feeding unit 3. Then, as described above, the first cam 30 rotates and the vertical shift bar 62 descends so that the selected suction nozzle 15 descends by a predetermined stroke, picks the electronic component D up from the component feeding unit 3, and rises up to position between the light detection sensors 76 and the reflection board 75. Detecting of presence or absence of the electronic component D is performed, and the vacuum suction operation is kept in a case where the result of the detection is "presence".

After that, multiple picking (sequential pick-up of the components as much as possible) is performed, similarly. When completing this multiple pick-up operation, the CPU 90 forms mounting sequence data and moves the beam 8 and the mounting heads 16 to a first mounting position where the component D is mounted on the printed board P first. That is, the CPU 90 stores coordinates of the first mounting position (a position stored in the mounting data before alignment of a pick-up position), where the electronic component D is mounted first, in the RAM 91 and set it as a coordinate value of a moving target position. Then, the CPU 90 moves the component recognition cameras 83 on a line which connects the last pick-up position of the component by the mounting head 16 and the first mounting position of the component on the printed board P by the mounting head 16.

Then, when the CPU 90 detects timing for the component recognition cameras 80 to take images, that is, timing where the mounting heads 16 passes above the cameras 80, the CPU makes the cameras 80 positioned on the line simultaneously take and store images of all the electronic components D picked up by the suction nozzles 15 of the left and right mounting heads 16 by "on the fly recognition without stopping of the beam 8" while the beam 8 is moving from the last pick-up position to the first mounting position. Then, the component recognition processing device (not shown) starts a component recognition process.

When a recognition result for the first component to be mounted is calculated by the component recognition processing device, the CPU detects whether the suction nozzle 15 is positioned on a first mounting position (a position in mounting data before alignment of a pick-up position) which is set as the coordinate value of the moving target position. If positioned, the CPU resets the coordinate value into a coordinate value of a moving target position calculated with the recognition (alignment) result and moves the beam 8 for positioning the suction nozzle 15 on a position of the reset target value. If not positioned, the set coordinate value of the moving target position is dynamically changed to the coordinate value calculated with the recognition (alignment) result.

When completing moving of the beam 8, the first electronic component D among the components D sequentially picked up by the suction nozzle 15 is mounted on the printed board P.

Figure 7:
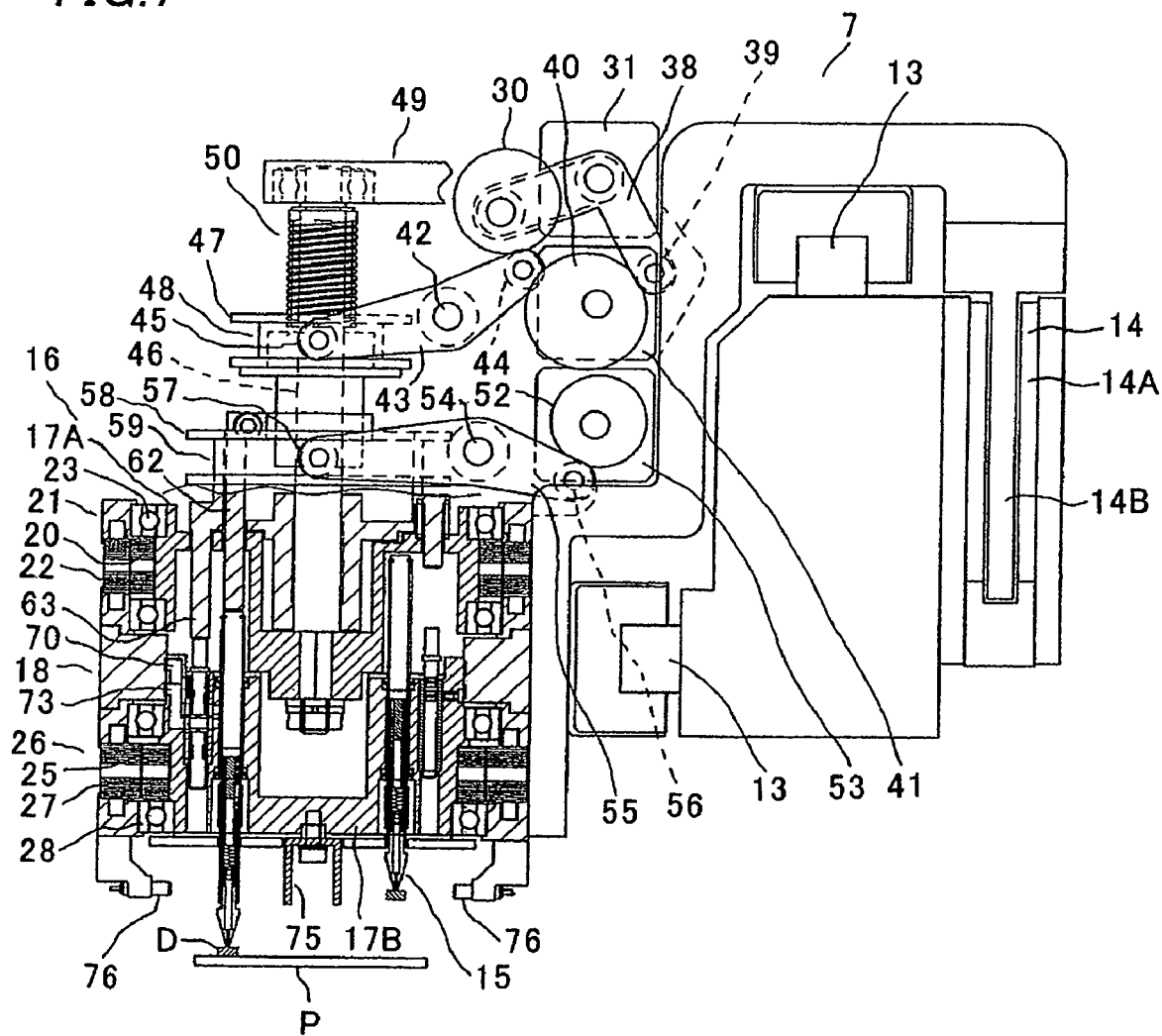
FIG. 7 is a side view of a vertical cross-section of the mounting head body of FIG. 5, mounting a thin electronic component.
Figure 8:
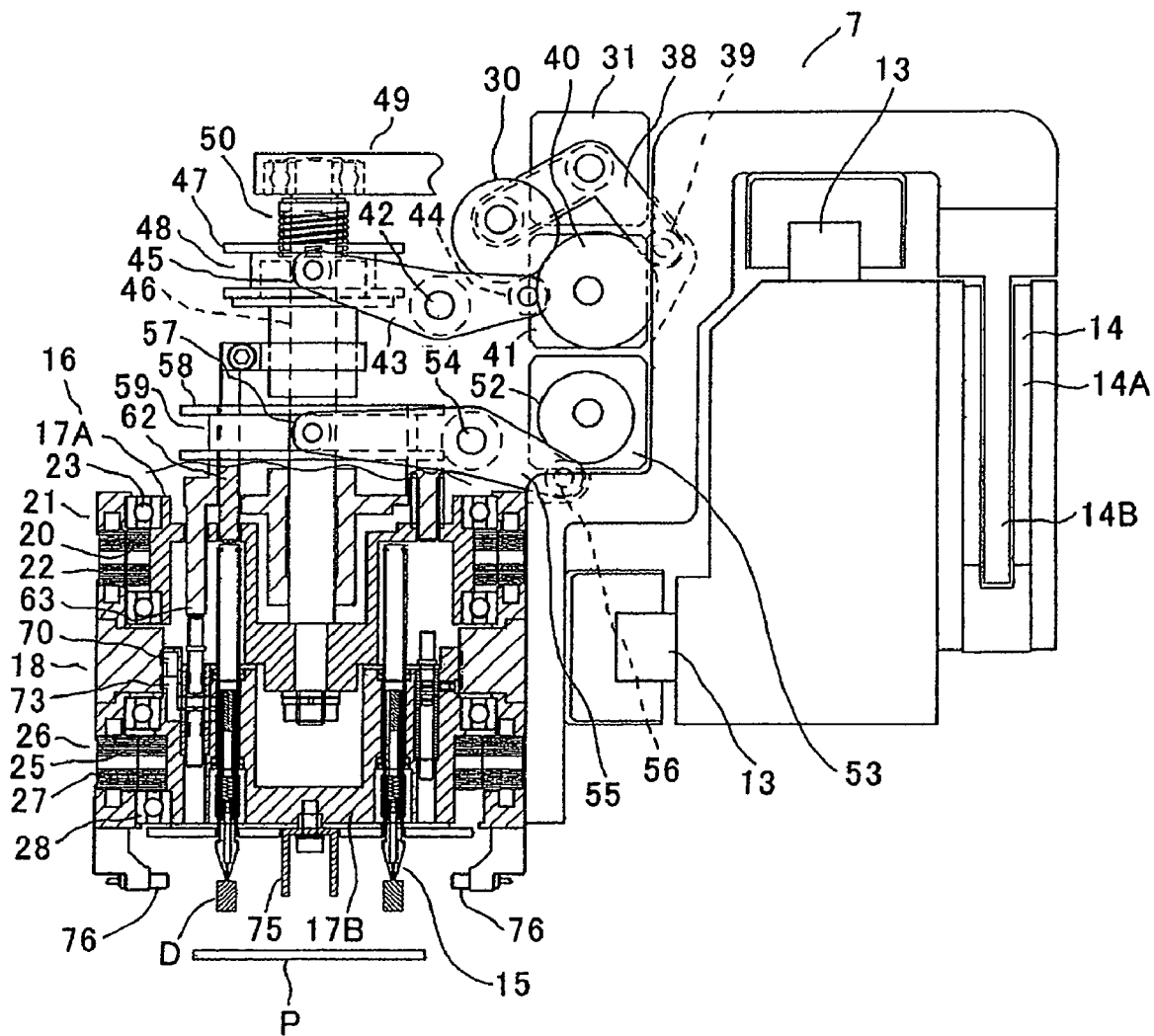
FIG. 8 is a side view of a vertical cross-section of the mounting head body of FIG. 5, holding a thick electronic component by suction.
Figure 9:
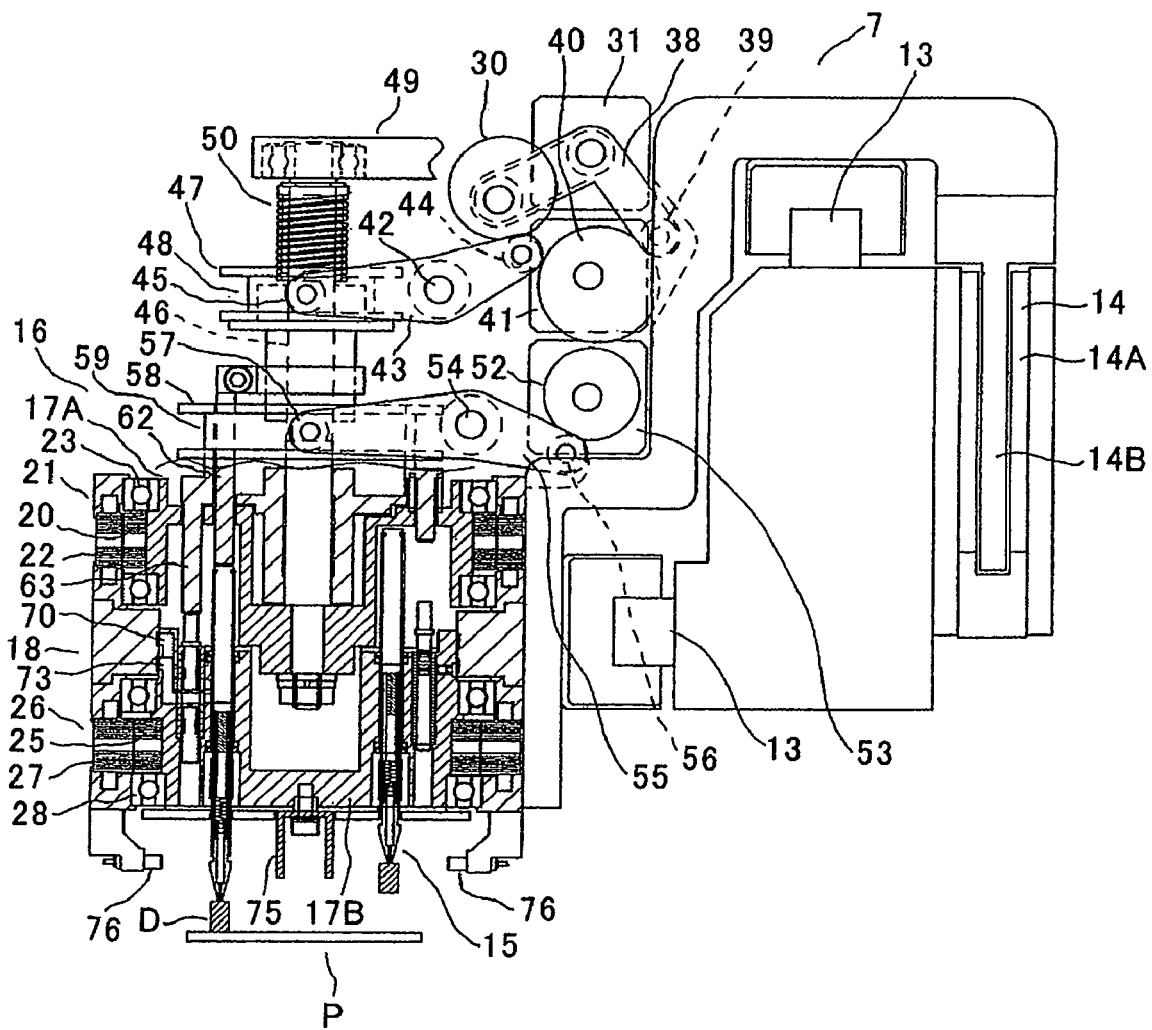
FIG. 9 is a side view of a vertical cross-section of the mounting head body of FIG. 5, mounting a thick electronic component.

In detail, the first cam 30 rotates driven by the drive motor 31 and the second cam 40 rotates driven by the drive motor 41, the second lever 43 turns to set at a predetermined angle around the support axis 42, and the vertical shift body 47 descends to lower the vertical shift bar 62. Thus, the suction nozzle 15 descends by a predetermined stroke corresponding to a thickness of the electronic component D and mounts the electronic component D on the printed board P (FIGS. 7 and 9).

On this mounting process, the vertical shift bar 63 of the vacuum valve switch operating body 58 descends to push the first switch bar 65 downward so that the vacuum path is disconnected from the vacuum source to stop the vacuum suction and air from the air supply source blows in the inner path 15A of the suction nozzle 15 through the air path 70, the path 71, and the connecting path 72. That is, when the suction nozzle 15 descends for mounting, the third cam 52 rotates to turn the third lever 55 and the vacuum valve switch operating body 58 descends corresponding to descending of the vertical shift body 47 through the cam engagement portion 59. Then, the vertical shift bar 63 of the operation body 58 pushes the first switch bar 65 downward, and the switch lever 68 turns around the support axis 67 to push the second switch bar 66 upward. The projected stopper 61 is engaged with the recess for engagement 69B of the second switch bar 66 so that the vacuum path is disconnected from the vacuum source to stop the vacuum suction.

The CPU 90 calculates next mounting operation of the electronic component D and repeats the mounting operation until all the picked electronic components D are mounted. In detail, the CPU 90 receives a recognition result calculated by the component recognition processing device, calculates a coordinate value of a moving target position in X, Y, and θ. Then, the CPU 90 drives the linear motor 9 to move the beam 8 in the Y direction to a target coordinate value calculated with the recognition result, drives the linear motor 14 to move the mounting head 16 in the X direction, and drives the pulse motors 21 and 26 to rotate the suction nozzle 15 to set at a θ angle. The first cam 30 and the second cam 40 rotate so that the suction nozzle 15 descends by a predetermined stroke corresponding to a thickness of the electronic component D and mounts the electronic component D on the printed board P. The CPU repeats this operation until all the electronic components D picked up by the suction nozzles 15 of the mounting head 16 are mounted.

When all the electronic components D specified in the mounting data are not mounted on the printed board P, the pick-up sequence data is formed again as described above, and the pick-up operation, the component recognition processing, and the mounting operation of the electronic components D are performed. When all the electronic components D specified in the mounting data are mounted on the printed board P, the beam 8 is returned to an original position, and the printed board P completing component mounting is mounted on the discharging conveyer 6, completing the mounting operation.

A control described below is performed in the movement of the beam 8 for picking the component up from the component feeding unit 3 or for mounting the component on the printed board P.

The motion control board 93 receives information necessary for moving the beam 8 in the Y direction, that is, the mounting data or the component disposition data, from the RAM 91 provided in the CPU board 89 through the bus 94, and stores the information in its memory (not shown), when performing operations to the printed board P. In each of the component pick-up and mounting operations, the motion control board 93 outputs a positioning command (an amount to be shifted) to the Y2 driver 96 and the Y1 driver 97 through the motion network line 95 based on the information stored in the memory.

When receiving the positioning command from the motion control board 93, each of the Y2 driver 96 and the Y1 driver 97 provides a predetermined electric current to the moving member 9B of each of the linear motors 9 through the power lines 98 and 99, respectively.

Then, a positional control is performed based on the linear scales, and the left and right linear motors 9 are driven to move the beam 8 to a predetermined position and the linear motor 14 is driven to move the mounting head body 7, performing the component pick-up or mounting operation.

At this time, it is desired that a positional relationship between the two drive axes is kept the same at any time when the beam 8 is moved by the two linear motors 9 as the left and right drive sources. However, an error can occur in the positional relationship between the two drive axes by a load imbalance between the axes, a synchronizing error in command sending to each of the axes, a friction imbalance between the axes, a difference between the linear scales between the axes, and so on.

Therefore, when the error occurs in the positional relationship between the drive axes when the beam 8 is moved by the two drive axes, the relationship between the Y1 and Y2 drive axes must be adjusted quickly. Here the "positional relationship" means the relative positioning of the moving member 9B on the Y1 axis and the moving member 9B on the Y2 axis, in other words, the positioning of the two ends of the beam 8 relative to its propagating direction. A mechanism to perform this adjustment will be described with reference to FIGS. 19 and 20.

Figure 19:
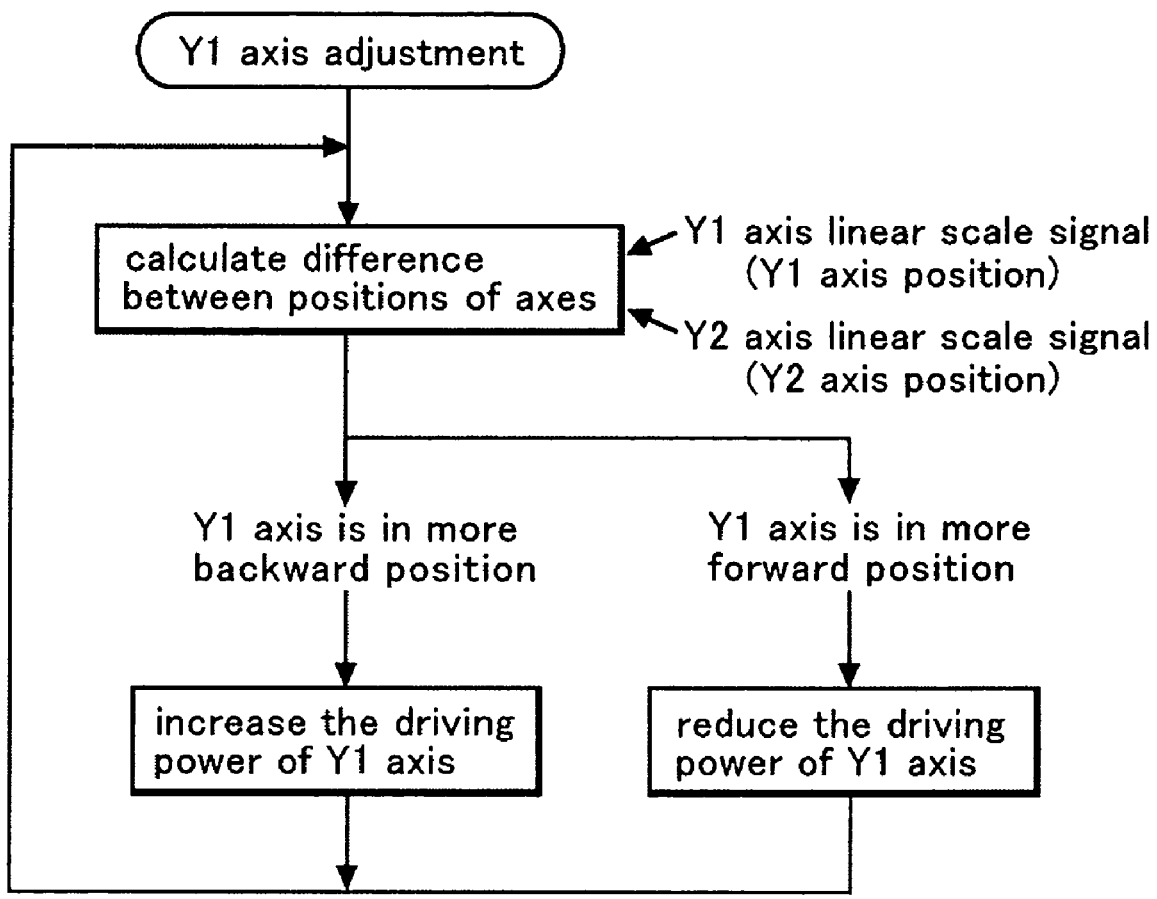
FIG. 19 is a flowchart of adjustment of a Y1 axis in the embodiment.

First, a description will be given on adjustment of the Y1 drive axis with reference to FIG. 19. According to the movement of the beam 8 for the component picking or mounting operation, the linear scale signals (outputs relating to positions of the Y1 drive axis and the Y2 drive axis) from the linear scale reading heads 100 and 101 are inputted to the Y1 driver 97.

Since the Y1 driver 97 has a calculation function and a control function, when inputted with both the linear scale signals, the Y1 driver 97 calculates a difference between positions of the drive axes of the beam 8, and based on the difference, controls the moving member 9B of the linear motor 9 at a right end of the beam 8 so as to increase the driving power of the moving member 9B of the Y1 drive axis in a case where the Y1 drive axis is in a more backward position than the Y2 drive axis and reduce the driving power in a case where the Y1 drive axis is in a more forward position than the Y2 drive axis.

Figure 20:
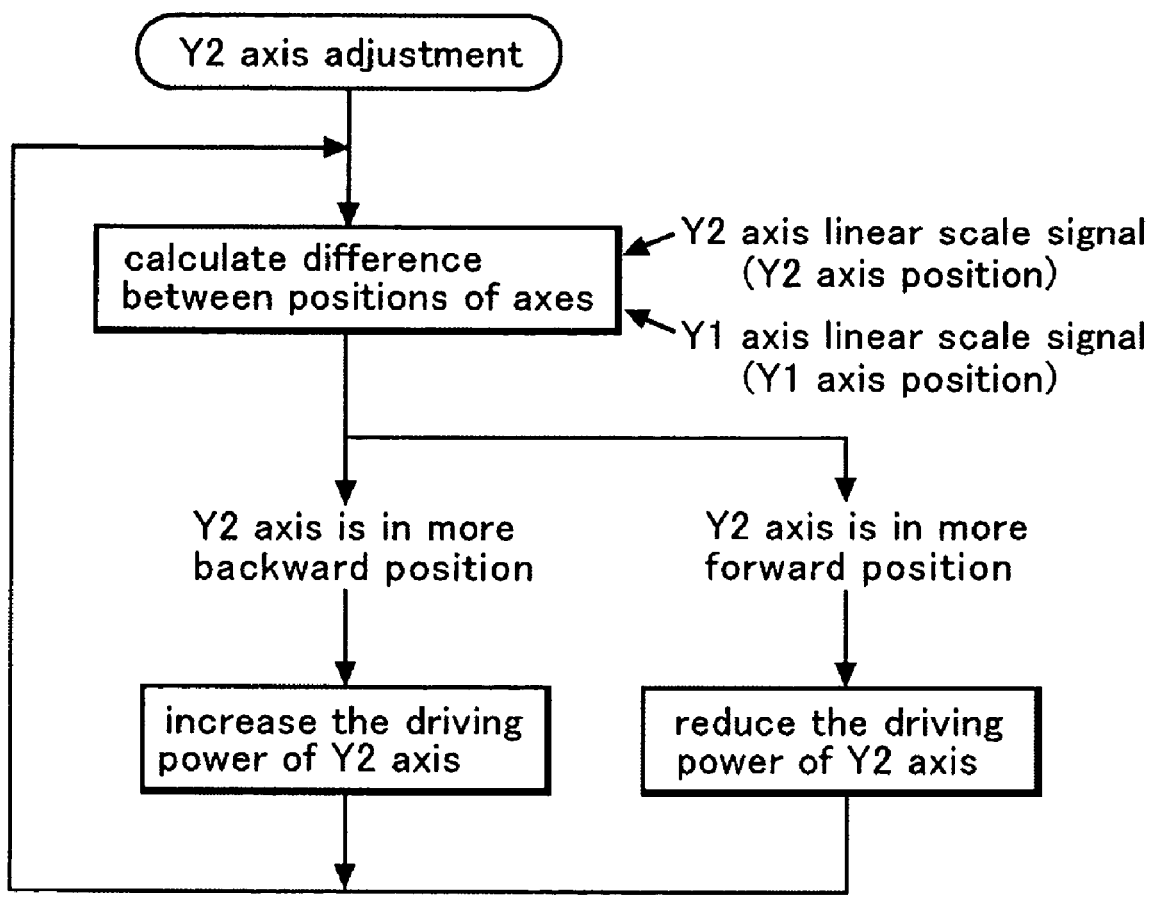
FIG. 20 is a flowchart of adjustment of a Y2 axis in the embodiment.

Next, a description will be given on adjustment of the Y2 drive axis with reference to FIG. 20. According to the movement of the beam 8 for the component picking or mounting operation, the linear scale signals (outputs relating to positions of the Y2 drive axis and the Y1 drive axis) from the linear scale reading heads 100 and 101 are inputted to the Y2 driver 96.

Since the Y2 driver 96 has a calculation function and a control function, when inputted with both the linear scale signals, the Y2 driver 96 calculates a difference between positions of the drive axes of the beam 8, and based on the difference, controls the moving member 9B of the linear motor 9 at a left end of the beam 8 so as to increase the driving power of the moving member 9B of the Y2 drive axis in a case where the Y2 drive axis is in a more backward position than the Y1 drive axis and reduce the driving power in a case where the Y2 drive axis is in a more forward position than the Y1 drive axis.

Accordingly, when the error occurs in the positional relationship between the two drive axes when the beam 8 is moved by the left and right linear motors 9 as the two drive sources, the relationship between the drive axes can be adjusted quickly. This reduces time relating to the mounting operation of the component on the printed board P.

Although both the Y2 driver 96 and the Y1 driver 97 are used for adjustment in the embodiment described above, it is possible to use either one of the Y2 driver 96 and the Y1 driver 97 for the adjustment. That is, in either one of the Y2 driver 96 and the Y1 driver 97 inputted with the two linear scale signals, the difference between positions of the drive axes of the beam 8 is calculated, and the moving member 9B of the linear motor 9 is controlled based on the difference so as to increase the driving power in a case where the one drive axis is in a more backward position than another drive axis and reduce the thrust of one drive axis in a case where the one drive axis is in a more forward position than another drive axis.

Although particular preferred embodiment of the invention has been disclosed in detail, it is recognized that variations or modifications of the disclosed apparatus are possible based on the disclosure for those skilled in the art and thus lie within the scope of this invention.

What is claimed is:

1. An electronic component mounting apparatus comprising:
   a component feeding unit feeding an electronic component;
   a beam moving in a first direction along a first drive axis and a second drive axis;
   a first driven portion moving the beam along the first drive axis;
   a second driven portion moving the beam along the second drive axis;
   a mounting head that moves along the beam for picking the electronic component up from the component feeding unit and mounting the electronic component on a printed board;
   a memory storing data on a picking up position of the electronic component and data on a mounting position of the electronic component on the printed board;
   a controller sending a command to move the beam to a position for the picking up and the mounting of the electronic component, the command being generated based on the data stored in the memory;
   a first driver circuit providing a first control electric current to the first driven portion in response to the command from the controller; and
   a second driver circuit providing a second control electric current to the second driven portion in response to the command from the controller,
   wherein the first driver circuit is configured to calculate a difference between positions of the first and second driven portions along the first direction and to adjust the first control electric current based on the difference so as to increase a driving power of the first driven portion when the first driven portion is behind the second driven portion along the first direction and to reduce the driving power when the first driven portion is ahead of the second driven portion along the first direction.

2. The electronic component mounting apparatus of claim 1, wherein the second driver circuit is configured to calculate the difference between positions of the first and second driven portions along the first direction and to adjust the second control electric current based on the difference so as to increase a driving power of the second driven portion when the second driven portion is behind the first driven portion along the first direction and to reduce the driving power when the second driven portion is ahead of the first driven portion along the first direction.

3. The electronic component mounting apparatus of claim 1, further comprising a first linear scale measuring the position of the first driven portion along the first direction and a second linear scale measuring the position of the second driven portion, wherein the first driver circuit calculates the difference based on positional information from the first and second linear scales.

4. The electronic component mounting apparatus of claim 2, further comprising a first linear scale measuring the position of the first driven portion and a second linear scale measuring the position of the second driven portion, wherein the first and second driver circuits calculate the difference based on positional information from the first and second linear scales.

5. The electronic component mounting apparatus of claim 1, wherein the first driven portion is placed at one end of the beam, and the second driven portion is placed at another end of the beam.

6. The electronic component mounting apparatus of claim 1, wherein the first driven portion comprises a moving part of a first linear motor, and the second driven portion comprises a moving part of a second linear motor.

* * * * *